United States Patent [19]

Richards et al.

[11] Patent Number: 5,412,338

[45] Date of Patent: May 2, 1995

[54] FREQUENCY SYNTHESIZER

[75] Inventors: Matthew J. Richards, London; James D. Y. Collier, Cambridge, both of England

[73] Assignee: Cambridge Consultants Limited, Cambridge, United Kingdom

[21] Appl. No.: 98,298

[22] PCT Filed: Feb. 4, 1992

[86] PCT No.: PCT/GB92/00203

§ 371 Date: Sep. 13, 1993

§ 102(e) Date: Sep. 13, 1993

[87] PCT Pub. No.: WO92/14218

PCT Pub. Date: Aug. 20, 1992

[30] Foreign Application Priority Data

Feb. 5, 1991 [GB] United Kingdom ............... 9102400

[51] Int. Cl.⁶ .................................. G06F 1/02
[52] U.S. Cl. ..................... 327/107; 364/721; 327/129
[58] Field of Search ............... 328/14, 27, 22; 307/529, 271; 341/139, 144; 364/721, 718

[56] References Cited

U.S. PATENT DOCUMENTS

| | | | |
|---|---|---|---|
| 3,728,719 | 4/1973 | Fish | 341/117 |
| 3,763,414 | 10/1973 | Clarke, Jr. | 318/605 |
| 4,524,326 | 6/1985 | Larson | 328/14 |
| 4,631,694 | 12/1986 | Single | 364/608 |
| 4,910,515 | 3/1990 | Iwamatsu | 341/139 |
| 4,931,796 | 6/1990 | Hasegawa et al. | 341/144 |
| 4,998,072 | 3/1991 | Sheffer | 328/14 |
| 5,258,937 | 11/1993 | Blackmon | 328/14 |
| 5,274,373 | 12/1993 | Kanoh | 341/144 |

FOREIGN PATENT DOCUMENTS 2353998 12/1977 France .
61-269405 11/1986 Japan ............... H03H 28/00

Primary Examiner—Timothy P. Callahan
Assistant Examiner—Dinh Le
Attorney, Agent, or Firm—Albert C. Smith

[57] ABSTRACT

A frequency synthesizer for generating a sinusoidal analogue signal comprises a digital signal generator for generating a substantially triangular digital signal. A digital to analogue converter (DAC) receives the digital signal. The DAC has a non-linear transfer function shaped to generate a sinusoidal analogue signal.

3 Claims, 5 Drawing Sheets

FREQUENCY SYNTHESIZER

FIELD OF THE INVENTION

The invention relates to a frequency synthesizer for generating a sinusoidal analogue signal, and in particular direct digital synthesizer or numerically controlled oscillators.

BACKGROUND OF THE INVENTION

Conventional direct digital synthesizers (DDS) comprise a digital triangle wave generator whose output signal is fed to a look-up table in the form of a PROM to shape or smooth the digital triangle wave, the output from the look-up table being fed to a digital-to-analogue converter (DAC) having a linear transfer function which then generates an analogue output sine wave. The problem with these known synthesizer is their complexity and expense.

SUMMARY OF THE INVENTION

In accordance with one aspect of the present invention, a frequency synthesizer for generating a sinusoidal analogue signal comprises means for generating a substantially triangular digital signal; and a digital-to-analogue converter which receives the digital signal and which has a non-linear transfer function shaped such that a sinusoidal analogue signal is generated.

We have developed a new approach in which the previously used PROM and DAC with a linear transfer function are replaced by a single DAC with a non-linear transfer function. This has the advantage that the fast PROM required in the conventional approach is no longer needed so saving chip area and cost.

Preferably, the non-linear transfer function generates a piece-wise linear approximation to a sine wave. The piece-wise linear approximation can be analysed as the sum of triangular pulse trains. For four segments there are four equations in cos (wt) so harmonics can be cancelled up to ninth order above which they will be small. Furthermore, as a sinewave moves from the zero crossing to the peak its slew rate decreases and the accuracy required reduces. This allows the complexity of the DAC to be reduced compared to a linear DAC improving yield and reducing chip area.

Preferably, the DAC comprises a number of subsidiary DACs; and control means responsive to the digital signal to activate different groups of the subsidiary DACs dependent on the segment of the sine wave being generated. This has the advantage that the individual segments or pieces can be trimmed by adjusting only the reference resistors of the subsidiary DACs, which is not interactive and should be easy to do in production. Furthermore, once the segments have been trimmed, monotonicity is guaranteed. In addition, it is very simple to interconnect DACs of differing resolution which is what is required for waveform synthesis.

In the preferred example, each subsidiary DAC comprises a conventional DAC with an additional switch so that the normally dumped current can be utilized. This is particular advantageous since only standard, binary DACs are required.

A further problem which can arise in conventional DDS systems is that since its amplitude is quantised (it can only change amplitude at integer multiples of the clock period) it effectively comprises a true sinewave plus an error signal. For practical reasons, the DAC resolution of both conventional DDS systems and systems according to the first aspect of the invention is limited and the digital sinewave (which can be very finely quantised and so have very little error) is truncated. The conventional truncation process completely loses the electrical information present in the least significant bits (LSB) and introduces errors in the form of non-harmonic, spurious tones which limit the dynamic range.

In accordance with a second aspect of the present invention, a frequency synthesizer for generating a sinusoidal analogue signal comprises means for generating a digital signal, each value of which has M bits; and a digital-to-analogue converter which receives the N most significant bits (MSBs) of the digital signal and generates in response an analogue sinewave signal characterised in that the synthesizer further comprises an adder between the digital signal generating means and the DAC, M−N least significant bits (LSBs) from the adder being fed back to be added by the adder to the M−N LSBs of the next succeeding digital value.

In this new approach, the information normally lost in truncation when the digital value is fed to the DAC is retained by adding that information to the next data sample before truncation. A significant benefit is obtained from the extra information available in the LSBs and it has been found that this changes the type of error to a more acceptable form.

Preferably, the digital signal generating means and the DAC are provided by a frequency synthesizer according to the first aspect of the invention.

In the preferred example, the components of the frequency synthesizer according to the first or the second aspect of the invention are fabricated on a single integrated circuit although this is not essential.

Some examples of frequency synthesizer according to the present invention will now be described and contrasted with known examples with reference to the accompanying drawings.

DESCRIPTION OF THE PREFERRED EMBODIMENT

Figure 1:
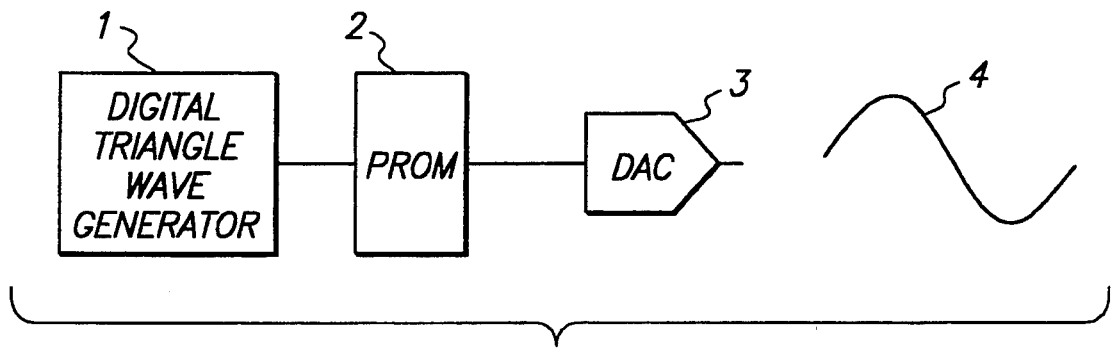
FIG. 1 is a block diagram of a conventional direct digital synthesizer.

FIG. 1 illustrates a conventional direct digital synthesizer DDS which comprises a digital triangle wave generator 1 whose output, digital triangle wave is fed to a look up table in the form of a PROM 2. The output from the PROM 2 is fed to a DAC 3 having a linear transfer function which generates an analogue sinewave 4.

Figure 2:
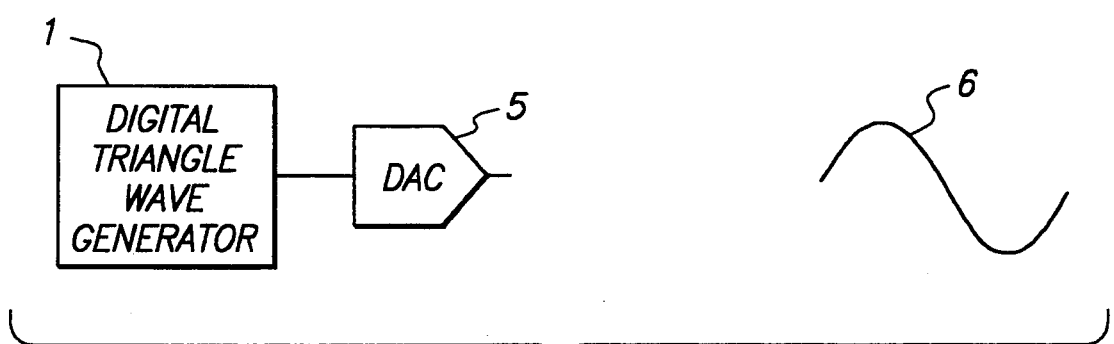
FIG. 2 is a block diagram of a synthesizer according to one example of the invention.

FIG. 2 illustrates a DDS according to one example of the invention. In this example, the digital triangle wave generator 1 is provided as before but this time the output from the generator feeds directly to a DAC 5 having a non-linear transfer function. In this context, "directly" means that no pre-shaping of the output from the generator 1 takes place before feeding to the DAC 5 although this must be understood in the context of the modification to be described below in FIG. 8. The output from the DAC 5 is a piece-wise linear sinewave 6.

Figure 3:
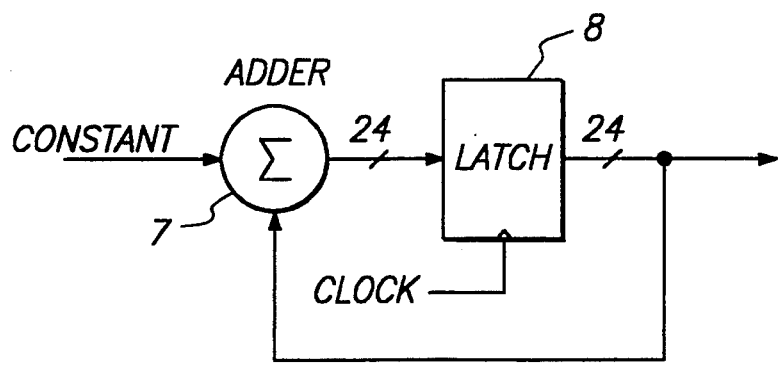
FIG. 3 is a block diagram of a digital triangle wave generator.

The construction of the digital triangle wave generator 1 is conventional and is shown schematically in FIG. 3. The generator essentially comprises a counter having an adder 7 whose 24 bit output is fed to a latch 8 forming a delay circuit. The output from the latch 8 is fed back to the adder 7 where it is added to a constant value. Consequently, the output from the latch 8 regularly increments by an amount corresponding to the constant value and by switching the sense of the output depending on the value of the most significant bit, a triangle wave is formed.

Figure 4:
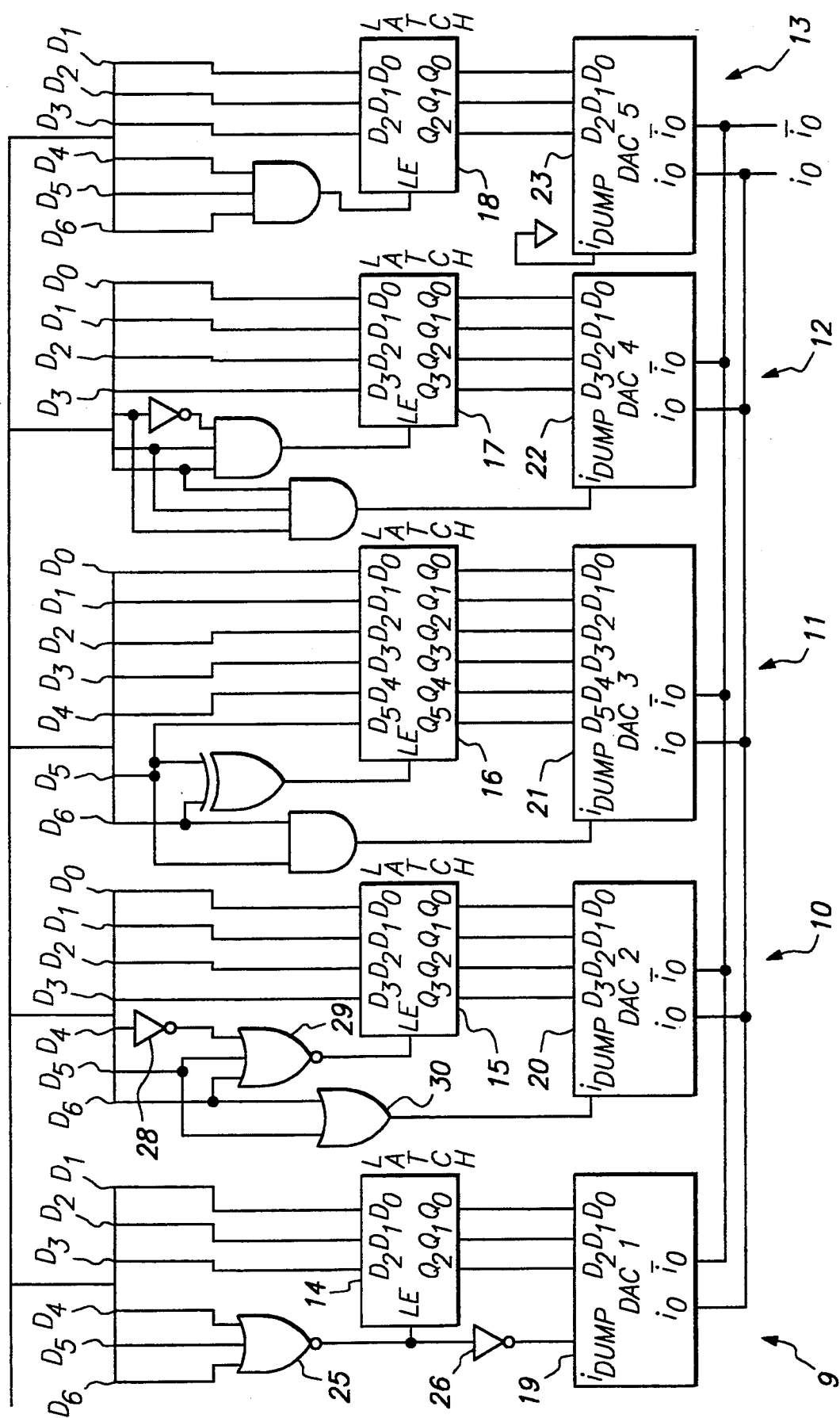
FIG. 4 is a block diagram of the DAC shown in FIG. 2.
Figure 5A:
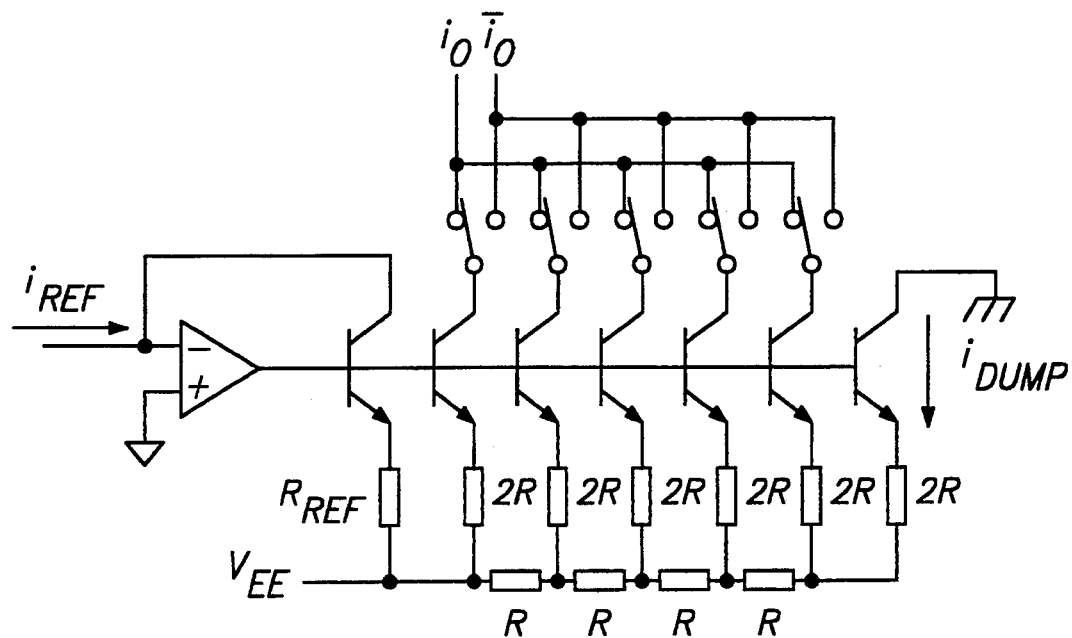
FIGS. 5A and 5B illustrate, respectively a standard binary DAC and a modified binary DAC for use in the FIG. 4 circuit.
Figure 5B:
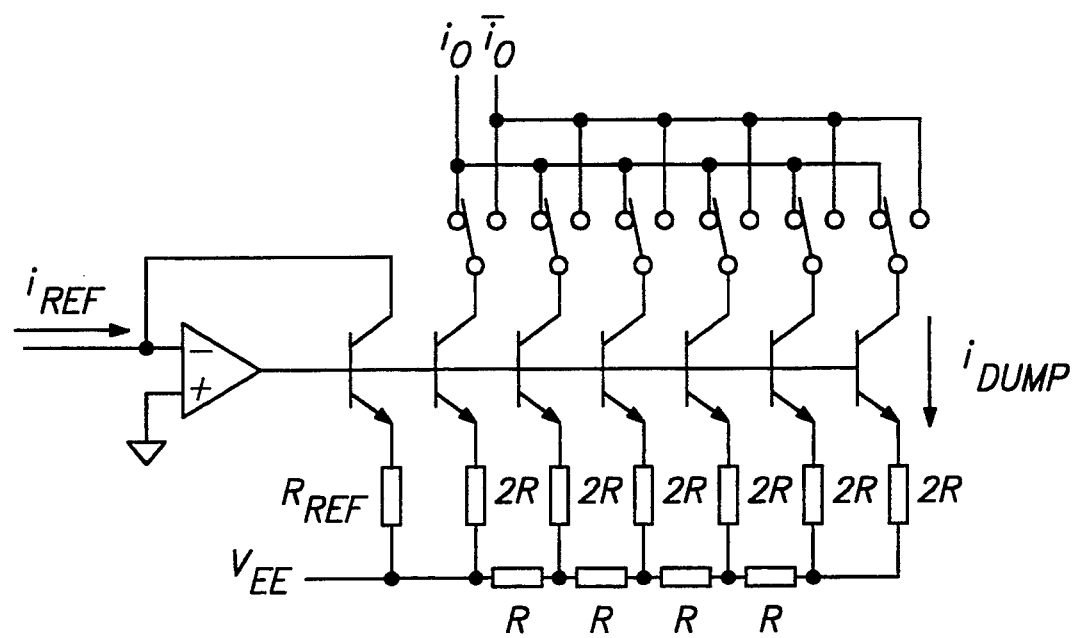

The construction of the DAC 5 is shown in FIG. 4. This will not be explained in detail but it can be seen that the DAC 5 comprises five sets of components 9–13 corresponding to the five segments or pieces of the sinewave which are generated in a half cycle. Each set of components comprises a latch 14–18 and a DAC 19–23 respectively. The construction of each DAC 19–23 is shown generally in FIG. 5B. FIG. 5A illustrates a conventional binary DAC where it will be seen that provision is made to dump the so-called "$i_{dump}$" output to ground. In the modified DAC (FIG. 5B) an additional switch is provided to enable the $i_{dump}$ current itself to be switched to the output of the DAC.

The operation of the DAC shown in FIG. 4 will now be described in connection with the first two sets of components 9, 10, the operation of the remainder of the components 11–13 being self-explanatory.

Figure 6:
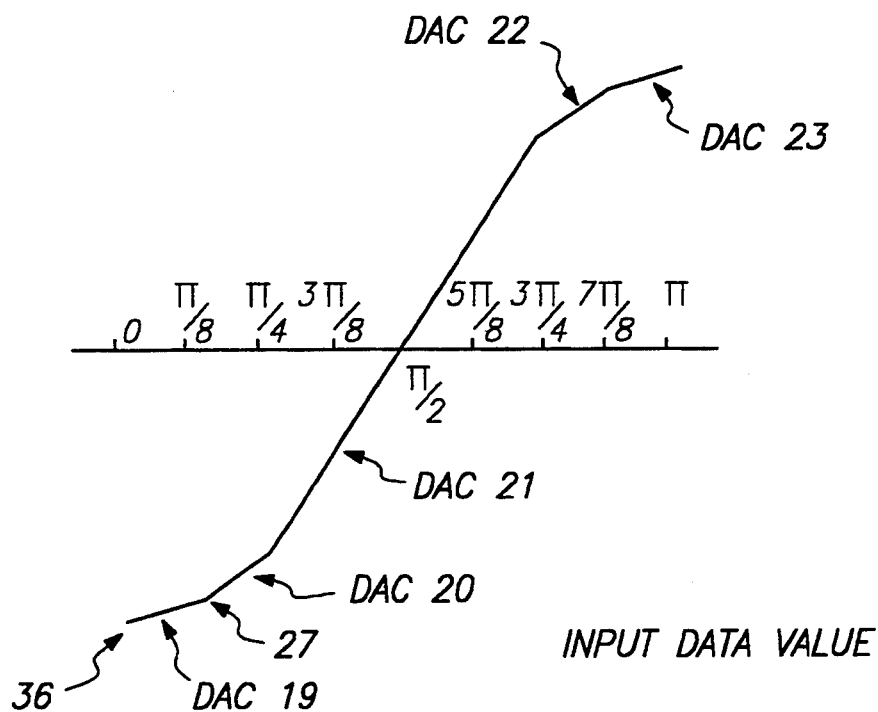
FIG. 6 illustrates part of a sinewave output by the DAC shown in FIG. 2.

The seven MSBs from the generator 1 are fed to the DAC 5 and, as can be seen in FIG. 6, since at this point 36 the curve is relatively shallow, the least significant of these bits is ignored and the next three bits $D_1$–$D_3$ are fed to the latch 14. The remaining three bits are fed to a NOR gate 25.

The output from the NOR gate 25 initially enables the latch 14 so that the data bits $D_1$–$D_3$ pass through the latch to the DAC 19. The output from the NOR gate 25 is also inverted by an inverter 26 so that the $i_{dump}$ output is non-enabled.

Initially, the databits $D_1$–$D_3$ are all zero with the result that the output current $i_0$ is zero. As the bits $D_1$–$D_3$ begin to increment a corresponding increase in current $i_0$ occurs until all three bits are "1". At the next clock cycle bit $D_0$ will change to a 1 and no different action will take place. At the next clock cycle, however, bit $D_4$ will change state to a "1" with the result that the output from the NOR gate 25 changes to a "0" thus deactivating the latch 14 and holding the values at $Q_0$–$Q_2$ at "1". In addition, the $i_{dump}$ current is activated to flow from the $i_0$ output of the DAC 19. The analogue sinewave has thus reached the point 27 (FIG. 6).

Upon the bit $D_4$ switching to a "1" the component 10 becomes active. This is because the bit $D_4$ is fed through an inverter 28 to a NOR gate 29 thus enabling the latch 15 while the bits $D_5$, $D_6$ are fed through an OR gate 30 to the $i_{dump}$ input of the DAC 20. These two bits will remain "0" so that the $i_{dump}$ current does not flow. Since at this part of the sinewave cycle the slope is relatively steep, the effect of the least significant bit is taken into account so that bits $D_0$–$D_3$ are fed to the latch 15. At the point where $D_4$ switches to a "1" the bits $D_0$–$D_3$ will all be zero so that the final increment in current is due to the DAC 19 when $i_{dump}$ is output. At the next clock cycle, $D_0$ changes to a 1 and this is passed through the latch 15 to the DAC 20 causing its $i_0$ output to increase above zero and hence be added to the output from the DAC 19 and so be output from the DAC 5 at the beginning of the next segment of the cycle. This then continues as before with the output current increasing until the output from DAC 20 is latched at the $i_{dump}$ value whereupon the components 11 come into play. This continues until the input value becomes 1111111 and then the digital values will begin to decrease and the reverse operation will take place.

FIG. 6 illustrates the different portions of the sinewave curve and the DACs 19–23 involved.

As will be appreciated from the previous discussion, the output from the generator 1 is truncated and this leads to significant quantisation of the finally output analogue signal. Furthermore, the digital signal provided by the generator 1 is itself quantised and if the constant value (FIG. 3) is not an integer factor of the highest count value then the generator will itself exhibit a degree of jitter which should be minimised.

Figure 7:
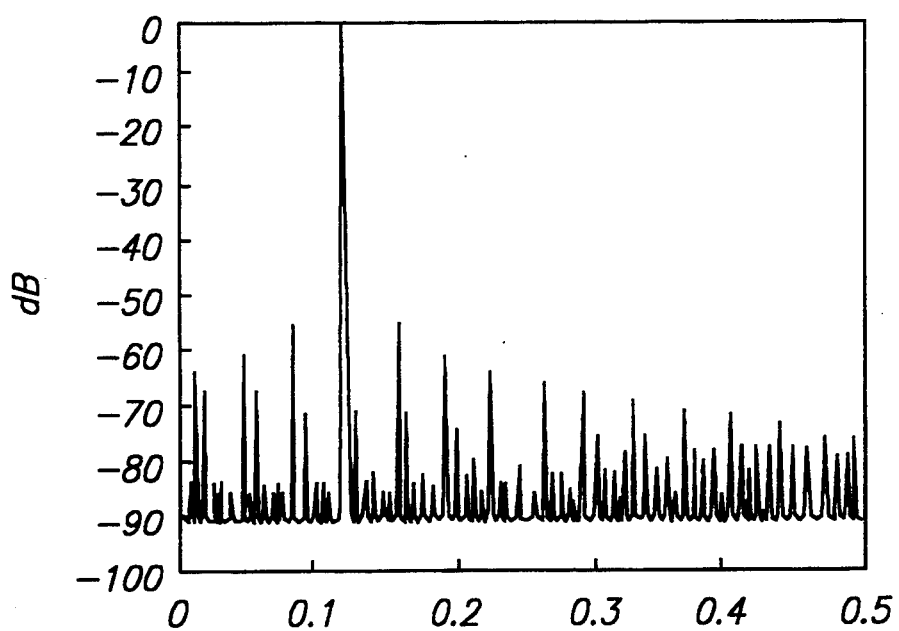
FIG. 7 is a Fourier transform of the output from a conventional direct digital synthesizer.

FIG. 7 is a fast Fourier transform of the output signal from a conventional DDS such as that shown in FIG. 1 and it will be seen that there are significant frequencies present on either side of the primary frequency.

Figure 8:
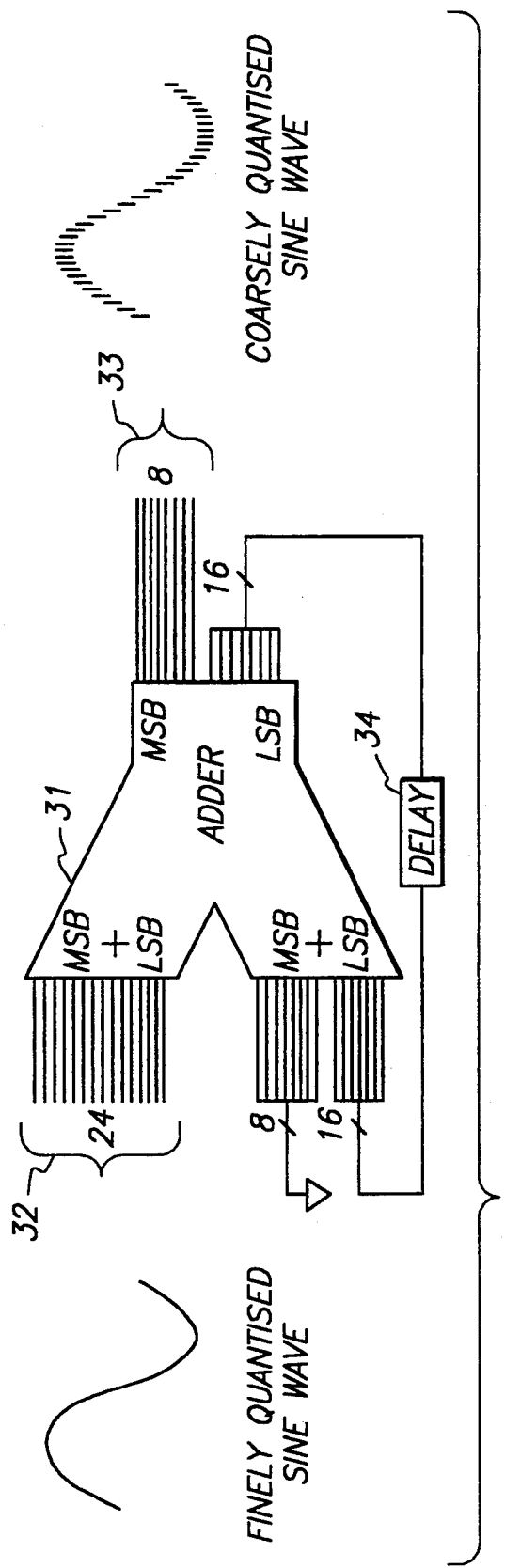
FIG. 8 illustrates an adder for insertion into the circuit shown in FIG. 2; and, FIG. 9 is a Fourier transform of the output from the circuit of FIG. 2 including the adder of FIG. 8.

To reduce this problem, it is proposed to insert an adder 31 between the generator 1 and DAC 5 (FIG. 8). The input to the adder 31 is a 24 bit digital value from the generator 1 as shown at 32 while the eight MSBs shown at 33 are fed to the DAC 5. The sixteen LSBs output by the adder 31 are fed back through a delay circuit 34 to the input of the adder 31 where they are added to the corresponding sixteen LSBs of the next digital value.

Figure 9:
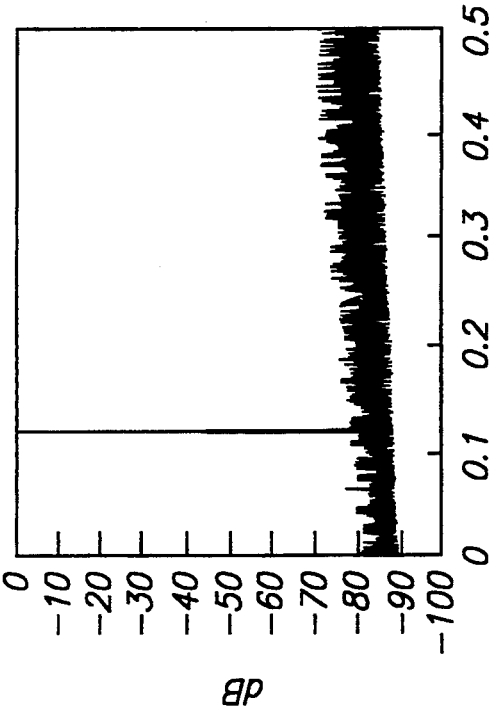

FIG. 9 illustrates a typical frequency plot of the output from such a modified synthesiser showing that the nature of the error has been spread into a densely sloping noise floor, increasing the dynamic range to 70 dB for a similar example to that above.

We claim:

1. A frequency synthesizer for generating a sinusoidal analogue signal, the synthesizer comprising generating means for generating a triangular digital signal; and a digital-to-analogue converter (DAC) comprising a number of subsidiary DACs, which receives the triangular digital signal and which has a non-linear transfer function shaped such that a sinusoidal analogue signal, which is a piece wise linear approximation to a sinewave, is generated by the DAC; wherein the DAC includes control means responsive to the triangular digital signal from the generating means to activate different groups of the subsidiary DACs dependent upon the piece of the sinewave being generated, and wherein at least one of the subsidiary DACs comprises a conventional DAC with an additional switch so that the normally dumped current can be switched to the output of the DAC.

2. A frequency synthesizer for generating a sinusoidal analogue signal, the synthesizer comprising digital signal generating means for generating a digital signal at an output, each value of which has M bits; and a digital-toanalogue converter which receives the N most significant bits (MSBs) from an adder and generates in response an analogue sinewave signal; wherein the adder has an output and has one input coupled to the output of the digital signal generating means, M−N least significant bits (LSBs) from the adder output being fed back and connected to the M−N least significant bits of another input of the adder to be added by the adder to the M−N LSBs of the next succeeding digital value, and the most significant bits of said another input are coupled to the ground.

3. A frequency synthesizer for generating a sinusoidal analogue signal, the synthesizer comprising digital signal generating means for generating a digital signal at an output, each value of which has M bits; and a digital-to-analogue converter which receives the N most significant bits (MSBs) from an adder and generates in response an analogue sinewave signal; wherein the adder has an output and has one input coupled to the output of the digital signal generating means, M−N least significant bits (LSBs) from the adder output being fed back and connected with delay means to the M−N least significant bits of another input of the adder to be added by the adder to the M−N LSBs of the next succeeding digital value; wherein the digital signal generating means generates a triangular digital signal and the DAC receives the digital signal and has a non-linear transfer function shaped for generating a sinusoidal analogue signal by the DAC.

* * * * *